(12) United States Patent
Sleight et al.

(10) Patent No.: US 8,575,009 B2
(45) Date of Patent: Nov. 5, 2013

(54) TWO-STEP HYDROGEN ANNEALING PROCESS FOR CREATING UNIFORM NON-PLANAR SEMICONDUCTOR DEVICES AT AGGRESSIVE PITCH

(75) Inventors: Jeffrey W. Sleight, Ridgefield, CT (US); Sarunya Bangsaruntip, Mount Kisco, NY (US)

(73) Assignee: International Business Machines Corporation, Armonk, NY (US)

( * ) Notice: Subject to any disclaimer, the term of this patent is extended or adjusted under 35 U.S.C. 154(b) by 51 days.

(21) Appl. No.: 13/414,744

(22) Filed: Mar. 8, 2012

(65) Prior Publication Data

US 2013/0237038 A1 Sep. 12, 2013

(51) Int. Cl.
*H01L 21/321* (2006.01)
*H01L 21/324* (2006.01)

(52) U.S. Cl.
USPC ............ 438/479; 438/151; 977/762; 977/858; 977/859; 977/888; 257/E21.324; 257/E21.618

(58) Field of Classification Search
USPC .......... 977/858, 859, 762, 855, 888; 438/151, 438/479, 492, 509; 257/E21.324, E21.618
See application file for complete search history.

(56) References Cited

U.S. PATENT DOCUMENTS

| | | | | |
|---|---|---|---|---|
| 7,064,372 B2 * | 6/2006 | Duan et al. | | 257/296 |
| 7,067,867 B2 * | 6/2006 | Duan et al. | | 257/296 |
| 7,135,728 B2 * | 11/2006 | Duan et al. | | 257/296 |
| 7,233,041 B2 * | 6/2007 | Duan et al. | | 257/296 |
| 7,262,501 B2 * | 8/2007 | Duan et al. | | 257/750 |
| 7,427,328 B2 * | 9/2008 | Duan et al. | | 118/300 |
| 7,851,841 B2 * | 12/2010 | Duan et al. | | 257/296 |
| 7,884,004 B2 * | 2/2011 | Bangsaruntip et al. | | 438/586 |
| 7,932,511 B2 * | 4/2011 | Duan et al. | | 257/9 |
| 8,008,146 B2 | 8/2011 | Bangsaruntip et al. | | |
| 8,026,521 B1 * | 9/2011 | Or-Bach et al. | | 257/67 |
| 8,030,186 B2 * | 10/2011 | Romano et al. | | 438/478 |
| 8,114,757 B1 * | 2/2012 | Or-Bach et al. | | 438/455 |
| 8,203,148 B2 * | 6/2012 | Sekar et al. | | 257/67 |
| 8,293,624 B2 * | 10/2012 | Romano et al. | | 438/478 |
| 8,309,991 B2 * | 11/2012 | Bangsaruntip et al. | | 257/213 |
| 8,313,990 B2 * | 11/2012 | Bangsaruntip et al. | | 438/151 |
| 8,379,458 B1 * | 2/2013 | Or-Bach et al. | | 365/189.011 |

(Continued)

OTHER PUBLICATIONS

Bangsaruntip et al., High Performance and Highly Uniform Gate-All-Around Silicon Nanowire MOSFETs With Wire Size Dependent Scaling, IEDM 2009, pp. 297-300.*

(Continued)

*Primary Examiner* — Mary Wilczewski
(74) *Attorney, Agent, or Firm* — Scully, Scott, Murphy & Presser, P.C.; H. Daniel Schnumann

(57) ABSTRACT

A two-step hydrogen anneal process has been developed for use in fabricating semiconductor nanowires for use in non-planar semiconductor devices. In the first part of the two-step hydrogen anneal process, which occurs prior to suspending a semiconductor nanowire, the initial roughness of at least the sidewalls of the semiconductor nanowire is reduced, while having at least the bottommost surface of the nanowire pinned to an uppermost surface of a substrate. After performing the first hydrogen anneal, the semiconductor nanowire is suspended and then a second hydrogen anneal is performed which further reduces the roughness of all exposed surfaces of the semiconductor nanowire and reshapes the semiconductor nanowire. By breaking the anneal into two steps, smaller semiconductor nanowires at a tight pitch survive the process and yield.

16 Claims, 7 Drawing Sheets

(56) References Cited

U.S. PATENT DOCUMENTS

| | | | |
|---|---|---|---|
| 8,420,455 B2* | 4/2013 | Bangsaruntip et al. | 438/142 |
| 8,440,542 B2* | 5/2013 | Sekar et al. | 438/455 |
| 8,441,043 B2* | 5/2013 | Bangsaruntip et al. | 257/213 |
| 8,445,337 B2* | 5/2013 | Bangsaruntip et al. | 438/151 |
| 2005/0079659 A1* | 4/2005 | Duan et al. | 438/197 |
| 2005/0110064 A1* | 5/2005 | Duan et al. | 257/296 |
| 2005/0181587 A1* | 8/2005 | Duan et al. | 438/551 |
| 2006/0151820 A1* | 7/2006 | Duan et al. | 257/296 |
| 2006/0211183 A1* | 9/2006 | Duan et al. | 438/149 |
| 2007/0012980 A1* | 1/2007 | Duan et al. | 257/296 |
| 2007/0120167 A1* | 5/2007 | Duan et al. | 257/296 |
| 2007/0228439 A1* | 10/2007 | Duan et al. | 257/296 |
| 2010/0155696 A1* | 6/2010 | Duan et al. | 257/14 |
| 2010/0193770 A1* | 8/2010 | Bangsaruntip et al. | 257/24 |
| 2010/0255680 A1* | 10/2010 | Barwicz et al. | 438/689 |
| 2010/0276662 A1* | 11/2010 | Colinge | 257/9 |
| 2011/0045660 A1* | 2/2011 | Romano et al. | 438/478 |
| 2011/0108804 A1* | 5/2011 | Bangsaruntip et al. | 257/24 |
| 2011/0133163 A1* | 6/2011 | Bangsaruntip et al. | 257/24 |
| 2011/0133166 A1* | 6/2011 | Bangsaruntip et al. | 257/24 |
| 2011/0133167 A1 | 6/2011 | Bangsaruntip et al. | |
| 2011/0278539 A1* | 11/2011 | Bangsaruntip et al. | 257/14 |
| 2011/0278543 A1* | 11/2011 | Bangsaruntip et al. | 257/24 |
| 2011/0278544 A1* | 11/2011 | Bangsaruntip et al. | 257/24 |
| 2011/0312163 A1* | 12/2011 | Romano et al. | 438/478 |
| 2012/0007051 A1* | 1/2012 | Bangsaruntip et al. | 257/24 |
| 2012/0088355 A1* | 4/2012 | Sekar et al. | 438/479 |
| 2012/0088367 A1* | 4/2012 | Sekar et al. | 438/694 |
| 2012/0193719 A1* | 8/2012 | Or-Bach et al. | 257/368 |
| 2012/0220102 A1* | 8/2012 | Or-Bach et al. | 438/458 |
| 2012/0261643 A1* | 10/2012 | Cohen et al. | 257/27 |
| 2012/0298948 A1* | 11/2012 | Bangsaruntip et al. | 257/9 |
| 2012/0299118 A1* | 11/2012 | Guo et al. | 257/392 |
| 2012/0302027 A1* | 11/2012 | Huang et al. | 438/297 |

OTHER PUBLICATIONS

Bangsaruntip, S., et al., "High Performance and Highly Uniform Gate-All-Around Silicon Nanowire MOSFETs with Wire Size Dependent Scaling", Electron Devices Meeting (IEDM), 2009 IEEE International Issue Date: Dec. 7-9, 2009 on pp. 1-4.

* cited by examiner

TWO-STEP HYDROGEN ANNEALING PROCESS FOR CREATING UNIFORM NON-PLANAR SEMICONDUCTOR DEVICES AT AGGRESSIVE PITCH

BACKGROUND

The present disclosure relates to semiconductor device manufacturing, and more particularly to a method of forming semiconductor nanowires for use in gate-all around semiconductor nanowire field effect transistors.

The use of non-planar semiconductor devices such as, for example, FinFETs, trigate and gate-all around semiconductor nanowire field effect transistors (FETs) is the next step in the evolution of complementary metal oxide semiconductor (CMOS) devices. Fabrication of such non-planar semiconductor devices with minimal variation in the device region is critical to obtain devices with uniform electrical characteristics.

SUMMARY

A two-step hydrogen anneal process has been developed for forming semiconductor nanowires that can be used in fabricating non-planar semiconductor devices. In the first part of the two-step hydrogen anneal process, which occurs prior to suspending a semiconductor nanowire, the initial roughness of at least the sidewalls of the semiconductor nanowire is reduced, while having at least the bottommost surface of the nanowire pinned to an uppermost surface of a substrate. After performing the first hydrogen anneal, the semiconductor nanowire is suspended and then a second hydrogen anneal is performed which further reduces the roughness of all exposed surfaces of the semiconductor nanowire and reshapes the semiconductor nanowire. By breaking the anneal into two steps, smaller semiconductor nanowires at a tight wire to wire pitch survive the process and yield.

In one aspect of the present disclosure, a method of fabricating semiconductor nanowires for use in non-planar semiconductor devices is provided that includes forming at least one semiconductor nanowire from at least an uppermost semiconductor layer of a substrate, wherein an end segment of the at least one semiconductor nanowire is attached to a first semiconductor pad region and another end segment of the at least one semiconductor nanowire is attached to a second semiconductor pad region.

The method of the present disclosure further includes performing a first hydrogen anneal on the at least one semiconductor nanowire with at least a bottommost surface of the at least one semiconductor nanowire in direct contact with an uppermost surface of the substrate. Next, a portion of the substrate that is located beneath the at least one semiconductor nanowire is removed so as to suspend the at least one semiconductor nanowire above a remaining portion of the substrate. After suspending the at least one semiconductor nanowire, a second hydrogen anneal is performed on the at least one semiconductor nanowire that is suspended above the remaining portion of the substrate.

DETAILED DESCRIPTION

Figure 1:
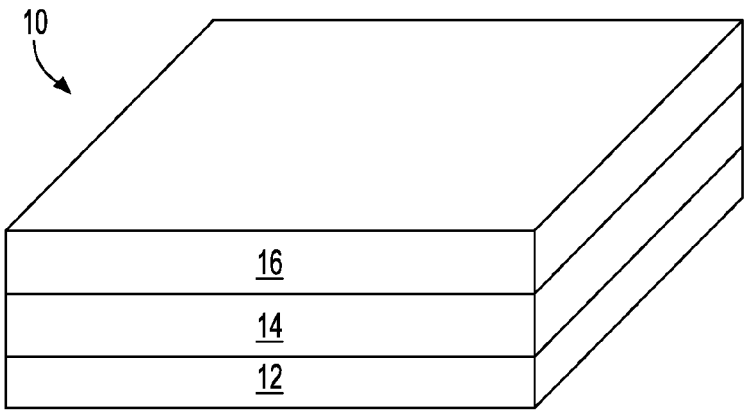
FIG. 1 is a perspective view depicting a semiconductor-on-insulator (SOI) substrate that can be employed in accordance with an embodiment of the present disclosure.

The present disclosure will now be described in greater detail by referring to the following discussion and drawings that accompany the present disclosure. It is noted that the drawings of the present disclosure are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present disclosure. However, it will be appreciated by one of ordinary skill in the art that the various embodiments of the present disclosure may be practiced without these specific details. In other instances, well-known structures or processing steps have not been described in detail in order to avoid obscuring the present disclosure.

As stated above, fabrication of non-planar semiconductor devices with minimal variation on the device geometry is critical to obtain devices with uniform electrical characteristics. It has been widely reported that the use of a single-step hydrogen anneal may be used to both thin and reshape semiconductor nanowires. Recent process development work by the applicants in the semiconductor nanowire field has shown however that the extension of the prior art hydrogen anneal to smaller features, which is driven by a need to build devices on aggressive wire to wire pitch, is non-trival. For example, applicants determined that the prior art single-step hydrogen anneal destroyed all of the smaller features.

To address the above problem, a two-step hydrogen anneal process has been developed for forming semiconductor nanowires, which can be used as a component of a non-planar semiconductor device. In the present disclosure, a first hydrogen anneal is performed prior to suspending the semiconductor nanowires and a second hydrogen anneal is performed after suspending the semiconductor nanowires. The term "non-planar" as used to describe a semiconductor device denotes devices formed with regions other than the top layer of the substrate.

In particular, a method of forming semiconductor nanowires using a two-step hydrogen anneal process is provided. In the first part of the two-step hydrogen anneal process, which occurs prior to suspending a semiconductor nanowire, the initial roughness of at least the sidewalls of the semiconductor nanowire is reduced, while having at least the bottommost surface of the nanowire pinned to an uppermost surface of a substrate. After performing the first hydrogen anneal, the semiconductor nanowire is suspended and then a second hydrogen anneal is performed which further reduces the roughness of all exposed surfaces of the semiconductor nanowire and reshapes the semiconductor wire.

By breaking the anneal into two separate steps, smaller semiconductor nanowires at a tight pitch survive the process and yield. By "tight pitch" it is meant wire to wire center distance is less than 70 nm. This has not however been achieved utilizing a single-step hydrogen anneal process. By "single-step hydrogen anneal" it is meant that the hydrogen anneal is performed without employing the non-suspended anneal of the present disclosure.

Referring first to FIG. 1, there is illustrated a semiconductor-on-insulator (SOI) substrate 10 that can be employed in one embodiment of the present disclosure. The SOI substrate 10 includes a handle substrate 12, an insulator layer 14 and a semiconductor-on-insulator (SOI) layer 16.

In some embodiments of the present disclosure (not specifically illustrated), the substrate is other than a SOI substrate. For example, the substrate can include a bulk semiconductor including a stack of at least two different semiconductor materials. In one embodiment, a stack of an upper semiconductor layer comprising Si and a lower semiconductor layer comprising SiGe, Ge or SiC may be employed. In the later example, nanowires can be formed in the upper semiconductor layer(s) comprising Si and the bottommost surface of the nanowires can be located on, i.e., pinned to, an uppermost surface of the lower semiconductor layer(s). Although embodiments are not shown using other substrates besides an SOI substrate, the two-step anneal process described herein below can be used in forming nanowires in such alternative substrates. In one embodiment, multiple stacked SOI substrates can be employed.

The handle substrate 12 of the SOI substrate 10 includes a first semiconductor material which can be selected from, but is not limited to, silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials. In some embodiments of the present disclosure, the material of the handle substrate 12 can be a single crystalline, i.e., epitaxial, semiconductor material. The term "single crystalline" as used throughout the present disclosure denotes a material in which the crystal lattice of the entire sample is continuous and unbroken to the edges of the sample, with no grain boundaries. In one example, the handle substrate 12 can be a single crystalline silicon material. In some embodiments, the handle substrate is a non-semiconductor material including, for example, a dielectric material and/or a conductive material.

All or portions of the handle substrate 12 can be doped to provide at least one globally or locally conductive region (not shown) located beneath the interface between the handle substrate 12 and the insulator layer 14. The dopant concentration in doped regions of the handle substrate 12 can be optimized for device performance. The thickness of the handle substrate 12 can be from 50 microns to 1 mm, although lesser and greater thicknesses can also be employed.

The insulator layer 14 of the SOI substrate 10, which is sandwiched between the handle substrate 12 and the SOI layer 16, may be referred to as a buried insulator layer. The insulator layer 14 can be a semiconductor oxide, a semiconductor nitride, a semiconductor oxynitride, or any multilayered stack thereof. In some embodiments, the insulator layer 14 is a silicon oxide layer. In one embodiment, the insulator layer 14 of the SOI substrate 10 can have a thickness from 10 nm 30 to nm. In another embodiment, the insulator layer 14 of the SOI substrate 10 can have a thickness from 2 nm to 200 nm.

The SOI layer 16 of the SOI substrate 10 includes a second semiconductor material which can be selected from, but is not limited to, silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials. In some embodiments of the present disclosure, the second semiconductor material of the SOI layer 16 can be a single crystalline, i.e., epitaxial, semiconductor material. In one example, the second semiconductor material of the SOI layer 16 can be a single crystalline silicon material. In one embodiment, the second semiconductor material of the SOI layer 16 may be comprised of a same semiconductor material as that of the handle substrate 12. In another embodiment, the second semiconductor material of the SOI layer 16 may be comprised of a different semiconductor material as that of the handle substrate 12. In one embodiment, the thickness of the SOI layer 16 can be from 40 nm to 200 nm. In another embodiment, the thickness of the SOI layer 16 can be from 4 nm to 5000 nm.

In some embodiments in which the SOI layer 16 has a thickness that is outside one of the aforementioned ranges, the SOI layer 16 can be thinned to a desired thickness within one of the above mentioned ranges by planarization, grinding, wet etching, dry etching, oxidation followed by oxide etching, or any combination thereof. One method of thinning an SOI layer 16 is to oxidize the semiconductor material, such as silicon, by a thermal dry or wet oxidation process, and then wet etching the semiconductor oxide layer, such as silicon oxide, using a hydrofluoric (HF) acid mixture. This process can be repeated to achieve the desired thickness of the SOI layer 16.

In some embodiments of the present disclosure, the SOI substrate 10 can be formed by implanting a high-energy dopant such as, for example, oxygen into a bulk semiconductor substrate and then annealing the structure to form the insulator layer 14 of the SOI substrate 10. In another embodiment, the insulator layer 14 may be deposited or grown by thermal techniques prior to the formation of the SOI layer 16. In yet another embodiment, the SOI substrate 10 can be formed using a wafer-bonding technique. Examples of some known processes for fabricating an SOI substrate which can be employed in the present disclosure include Separation by Implanted OXygen (SIMOX) or wafer bonding using Smart-Cut™.

Figure 2:
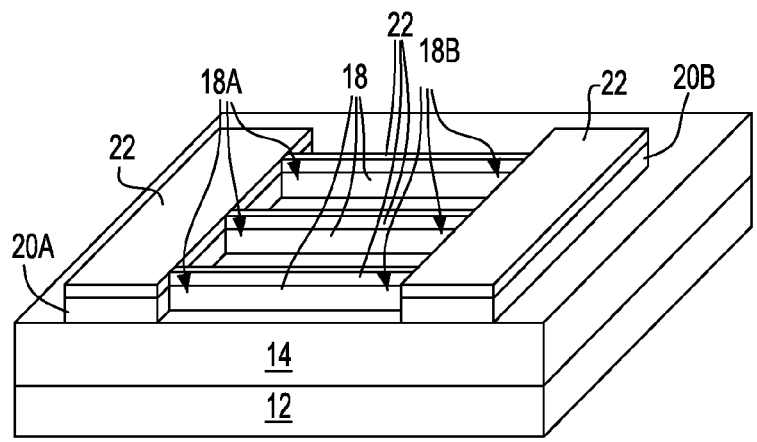
FIG. 2 is a perspective view of the SOI substrate of FIG. 1 after patterning an SOI layer of the SOI substrate to provide at least one semiconductor nanowire that has an end segment connected to a first SOI pad region and another end segment connected to a second SOI pad region.

Referring now to FIG. 2, there is illustrated the SOI substrate 10 shown in FIG. 1 after forming at least one semiconductor nanowire 18 that has an end segment 18A that is connected to a first SOI pad region 20A and another end segment 18B that is connected to a second SOI pad region 20B. In one embodiment, and as illustrated in FIG. 2, a patterned mask 22 can be present atop the at least one semiconductor nanowire 18, the first SOI pad region 20A and the second SOI pad region 20B. In another embodiment, the patterned mask 22 is not present atop the structure of FIG. 2. In some embodiments, other regions of the substrate can include at least one other semiconductor nanowire that has an end segment that is connected to a SOI pad region and another end segment that is connected to another SOI pad region. The other regions can be formed adjacent to the region depicted in FIG. 2 of the present disclosure. In some embodiments, one of the SOI pad regions for the at least one other semiconductor nanowire can be one of the SOI pad regions 20A, 20B shown in FIG. 2.

The at least one semiconductor nanowire 18, the first pad region 20A and the second SOI pad region 20B are comprised of the same second semiconductor material as SOI layer 16. As shown, the at least one semiconductor nanowire 18 is orientated perpendicular relative to the orientation of the first and second SOI pad regions 20A, 20B. In one embodiment, the patterned mask 22 can be comprised of a hard mask material such as, for example, an oxide, nitride, and/or oxynitride. In another embodiment, the patterned mask 22 can be comprised of a photoresist material. In a further embodiment, the patterned mask 22 can be comprised of a material stack of a hard mask material and a photoresist.

The structure shown in FIG. 2 can be formed by patterning the SOI layer 16 utilizing lithography, followed by an etch process such as, for example, reactive ion etching (RIE). Prior to performing the lithography step a hard mask material can optionally be formed atop the SOI layer 16 utilizing conventional techniques well known to those skilled in the art. For example, chemical vapor deposition, plasma enhanced chemical vapor deposition, or thermal growth can be used to form the hard mask material.

The lithographic step can include forming a photoresist atop the SOI layer 16, exposing the photoresist to a desired pattern of radiation and then developing the exposed photoresist or unexposed photoresist utilizing a conventional resist developer. The etch process that is employed in the present disclosure is selective so it preferentially removes exposed portions of the SOI layer 16 but not the underlying insulator layer 14. If a hard mask is present, a separate etch or the same etch that is used in removing the exposed portions of the SOI layer 16 can be used. In some embodiments, a reactive ion etch utilizing hydrogen bromide (HBr) can be employed. Typically, a slab comprising a portion of the SOI layer and optionally the patterned mask is first formed (by lithography and etching) and a second sequence of lithography and etching is used to pattern the slab into the structure shown in FIG. 2 which includes at least one semiconductor nanowire 18 and the first and second SOI pad regions 20A, 20B.

At this point of the present disclosure, the exposed surfaces, typically the sidewall surfaces and optionally the uppermost surface, of the at least one semiconductor nanowires 18, have a first roughness. In one embodiment, the first roughness of the exposed surfaces of the at least one semiconductor nanowire 18, expressed in terms of a root mean squared roughness, is from 0.5 nm to 5 nm. In another embodiment, the first roughness of the exposed surfaces of the at least one semiconductor nanowire 18, expressed in terms of a root mean squared roughness, is from 0.7 nm to 2.0 nm.

In one embodiment of the present disclosure and for tight pitch devices, the pitch (p), i.e., distance from a central portion of one semiconductor nanowire to a central portion of its nearest neighboring semiconductor nanowire, is from 5 nm to 70 nm. In another embodiment of the present disclosure and for tight pitch devices, the pitch (p) is from 20 nm to 40 nm. Other pitches that are greater than the ranges provided above can be obtained in the present disclosure. In some embodiments, the pitch between each semiconductor nanowire 18 is constant. In another embodiment, the pitch between each semiconductor nanowire 18 can vary.

The width of each of the semiconductor nanowires 18, which can be referred to herein as a first width, that is formed at this point of the present disclosure can vary depending on the process conditions used in fabricating the same. In one embodiment, the first width of the at least one semiconductor nanowire 18 is from 3 nm to 50 nm. In another embodiment, the first width of the at least one semiconductor nanowire 18 is from 5 nm to 22 nm.

Figure 3:
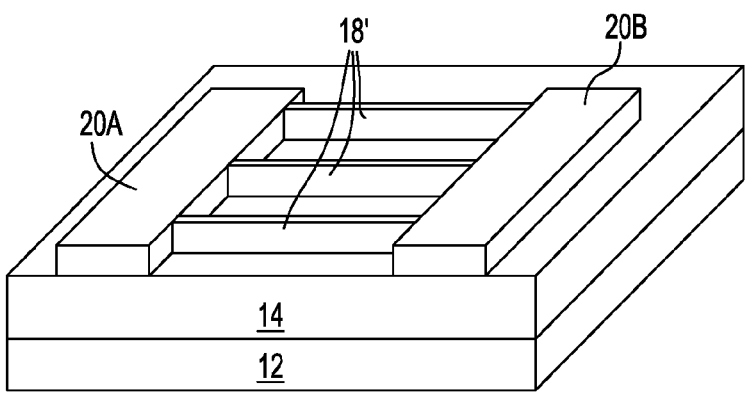
FIG. 3 is a perspective view of the structure shown in FIG. 2 after performing a first hydrogen anneal with at least a bottommost surface of the at least one semiconductor nanowire pinned to an uppermost surface of an insulator layer of the SOI substrate.

Referring to FIG. 3, there is shown the structure of FIG. 2 after performing a first hydrogen anneal with at least the bottommost surface of the at least one semiconductor nanowire 18 pinned to an uppermost surface of the insulator layer 14 of the SOI substrate 10. In the particular embodiment illustrated, the uppermost surface of the at least semiconductor nanowire 18 is pinned to a bottommost surface of the patterned mask 22. The term "pinned" denotes that a surface, typically the bottommost surface, of the at least one semiconductor nanowire 18 is in direct contact within another material layer, typically a portion of the insulator layer 14, and thus that surface which is in direct contact with the another material layer is not subjected to direct exposure of the first hydrogen anneal. Since the bottommost surface of the at least one semiconductor nanowire 18 and optionally the uppermost surface of the at least one semiconductor nanowire 18 are pinned, the first hydrogen anneal typically reduces the surface roughness of the sidewalls of each semiconductor nanowire 18. In FIG. 3, reference numeral 18' denotes that at least one semiconductor nanowire after exposing the same to the first hydrogen anneal of the present disclosure.

At this point of the present disclosure, the exposed surfaces, typically the sidewall surfaces and optionally the uppermost surface, of the at least one semiconductor nanowires 18', have a second roughness which is less than the first roughness of the at least one semiconductor nanowire 18. In one embodiment, the second roughness of the exposed surfaces of the at least one semiconductor nanowire 18', expressed in terms of a root mean squared roughness, is from 0.3 nm to 2 nm. In another embodiment, the second roughness of the exposed surfaces of the at least one semiconductor nanowire 18', expressed in terms of a root mean squared roughness, is from 0.4 nm to 1 nm.

It is noted that the first hydrogen anneal of the present disclosure reduces the first roughness of the exposed surfaces, typically the sidewall surfaces, of the at least one semiconductor nanowire 18, to a second roughness that is less than the first roughness.

The first hydrogen anneal can be referred to herein as a non-suspended hydrogen anneal since the bottommost surface of the at least one semiconductor nanowire 18 during the first hydrogen anneal is pinned to the insulator layer 14. In one embodiment, the first hydrogen anneal employed in the present disclosure can be performed at a temperature from 600° C. to 1000° C. The pressure of hydrogen used during the anneal can range from 7 torr to 600 torr.

At this point of the present disclosure, each of the semiconductor nanowires 18' has a second width. In some embodiments of the present disclosure, the second width is substantially the same as the first width of the semiconductor nanowires 18. The term "substantially the same" as used herein in connection with the first, second and third widths denotes that the first, second and third widths are within ±0.5 nm of each other. In some embodiments, the second width is less than the first width, while in other embodiments the second width may be greater than the first width. Notwithstanding which embodiment is achieved, the second width of the at least one semiconductor nanowire 18' is typically from 3 nm to 50 nm. In another embodiment, the second width of the at least one semiconductor nanowire 18' is from 5 nm to 22 nm.

Figure 4:
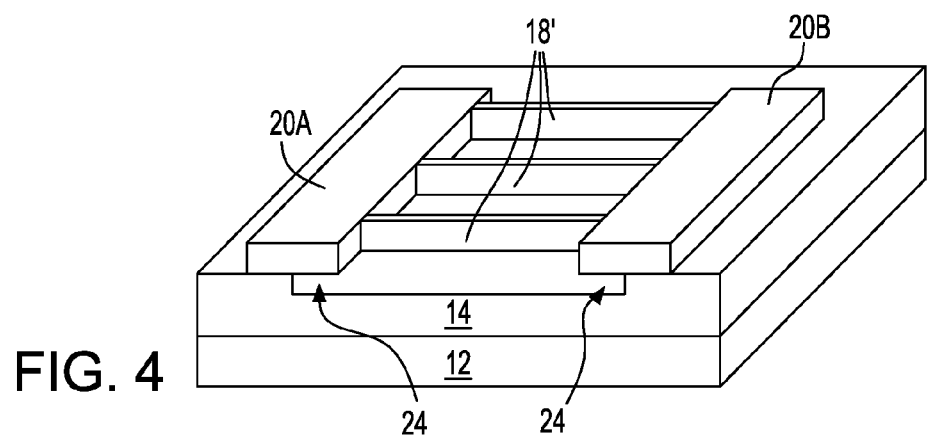
FIG. 4 is a perspective view of the structure shown in FIG. 3 after suspending the at least one semiconductor nanowire which was subjected to the first hydrogen anneal.

Referring now to FIG. 4 there is shown the structure of FIG. 3 after suspending the at least one semiconductor nanowire 18' which was subjected to the first hydrogen anneal. Specifically, FIG. 4 illustrates the structure of FIG. 3 after a portion of the insulator layer 14 located beneath each of the at least one semiconductor nanowires 18' and portions of the first and SOI pad regions 20A, 20B are removed. In FIG. 4, reference numeral 24 denotes an undercut that is formed beneath each of the first and second SOI pad regions 20A, 20B. In some embodiments of the present disclosure, patterned mask 22 can be removed during the suspending of the at least one semiconductor nanowire 18'. In another embodiment, the patterned mask 22 can be removed prior to or after the suspending process utilizing a separate etch that selectively removes the patterned mask 22.

The portion of the insulator layer 14 located beneath each of the at least one semiconductor nanowires 18' and portions of the first and SOI pad regions 20A, 20B can be removed utilizing an isotropic etching process. In one embodiment of the present disclosure, the isotropic etching may be, for example, performed using a diluted hydrofluoric acid (DHF). In one embodiment, a 100:1 DHF etches approximately 2 to 3 nm of a buried oxide layer per minute at room temperature.

As shown in FIG. 4, the insulator layer 14 is recessed in regions not covered by the SOI pad regions 20A, 20B. The isotropic etching results in the lateral etching of portions of the insulator layer 14 that are under the SOI pad regions 20A, 20B. The lateral etch thus suspends the at least one semiconductor nanowire 18' above the remaining portion of the insulator layer 14.

Figure 5:
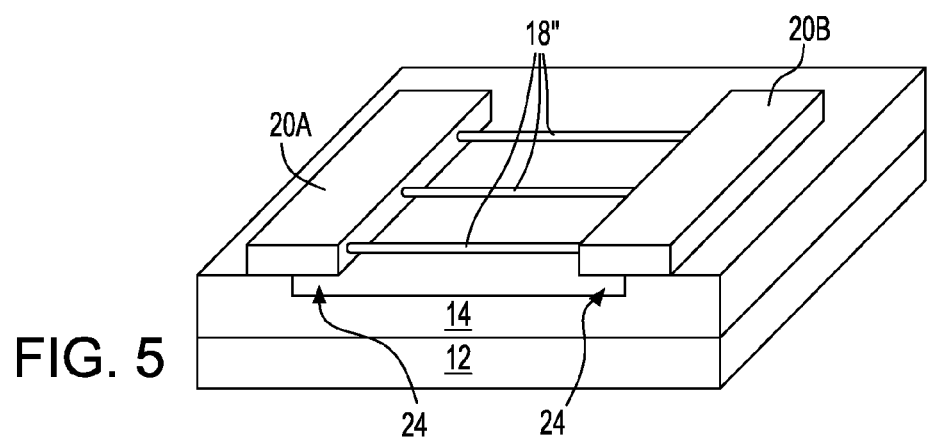
FIG. 5 is a perspective view of the structure shown in FIG. 4 after performing a second hydrogen anneal on the suspended at least one semiconductor nanowire.

Referring now to FIG. 5, there is illustrated the structure shown in FIG. 4 after performing a second hydrogen anneal on the suspended at least one semiconductor nanowire 18'. The second hydrogen anneal, which may be referred to as a suspended hydrogen anneal, is performed without any surfaces (i.e., bottommost and uppermost) of the at least one semiconductor nanowire 18' pinned. In FIG. 5, reference numeral 18" denotes the at least one semiconductor nanowire after performing the non-suspended hydrogen anneal, e.g., the second hydrogen anneal.

The second hydrogen anneal of the present disclosure further reduces the surface roughness of the semiconductor nanowires 18', while shaping each of the at least one semiconductor nanowires 18" into a cylindrical shape with elliptical or circular cross-section. Specifically, and at this point of the present disclosure, the at least one semiconductor nanowires 18" has a third roughness which is less than the second roughness of the at least one semiconductor nanowire 18'. In one embodiment, the third roughness of the at least one semiconductor nanowire 18", expressed in terms of a root mean squared roughness, is from 0.1 nm to 1 nm. In another embodiment, the third roughness of the at least one semiconductor nanowire 18", expressed in terms of a root mean squared roughness, is from 0.3 nm to 0.5 nm.

At this point of the present disclosure, each of the semiconductor nanowires 18" has a third width. In some embodiments of the present disclosure, the third width is substantially the same as the second width of the semiconductor nanowires 18'. In other embodiments of the present disclosure, the third width is less than the second width. In yet another embodiment, the third width is greater than the second width. Notwithstanding which embodiment is achieved, the third width of the at least one semiconductor nanowire 18" is typically from 3 nm to 50 nm.

In another embodiment, the third width of the at least one semiconductor nanowire 18" is from 5 nm to 22 nm.

It is noted that after exposing the at least one semiconductor nanowire 18' that is suspended to the second hydrogen anneal tight pitch nanowires survive the two-step hydrogen anneal process of the present disclosure, while such tight pitch nanowires are completely destroyed utilizing a single-step hydrogen anneal. This aspect of the present disclosure will be described in greater detail herein below, with reference to the SEMs shown in FIGS. 11A, 11B, 11C, 12, 13A, 13B, 13C and 14.

In one embodiment, the second hydrogen anneal employed in the present disclosure can be performed at a temperature from 600° C. to 1000° C. The pressure of hydrogen used during the second hydrogen anneal can range from 7 torr to 600 torr. In some embodiments of the present disclosure, the conditions, i.e., anneal temperature and/or hydrogen pressure, of the second hydrogen anneal can be less than the conditions, i.e., anneal temperature and/or hydrogen pressure of the first hydrogen anneal.

In some embodiments, the at least one semiconductor nanowire 18" that was subjected to the second hydrogen anneal can be further thinned for additional critical dimension reduction. This further thinning step can be performed by first subjecting the entirety of each semiconductor nanowire 18" to a high temperature (greater than 700° C.) oxidation to grow a thermal oxide layer or alternatively a chemical oxide layer can be grown by a wet process. The oxide layer is then etched away. The oxidation and etching can be repeated on the entirety of the at least one semiconductor nanowire 18" to provide a desired critical dimension to the at least one semiconductor nanowire 18".

Reference is now made to FIGS. 6-10 which illustrate a gate first process flow that can be used with the two-step hydrogen anneal process mentioned above to provide a non-planar semiconductor device, e.g., a gate-all around semiconductor nanowire FET. Although illustration is made to a gate first process flow, the two-step hydrogen anneal can be implemented in other types of process flows including for example, a gate last process flow. Also, the two-step hydrogen anneal process can be implemented in gate first process flow in which exposed portions of the semiconductor nanowires outside the gates are removed together with any semiconductor pad regions.

Figure 6:
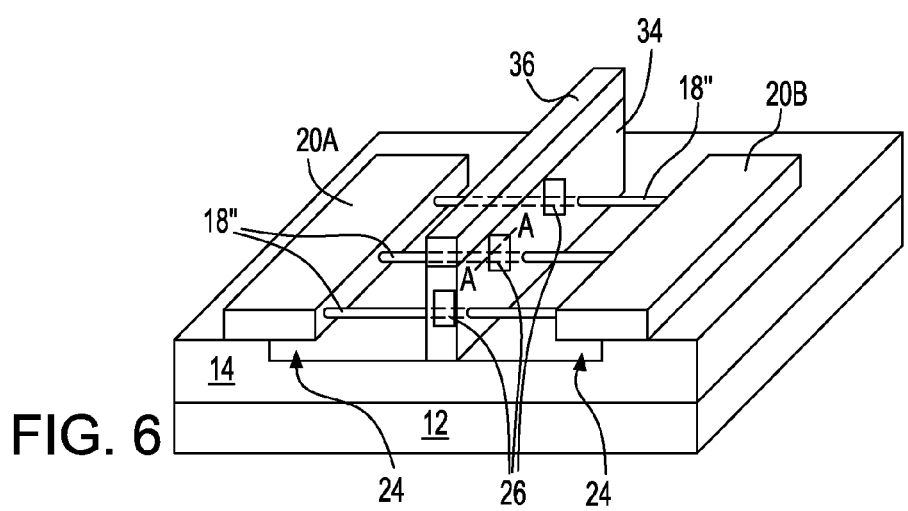
FIG. 6 is a perspective view of the structure shown in FIG. 5 after gate formation around a central portion of the suspended at least one semiconductor nanowire which was subjected to the second hydrogen anneal.

Referring now to FIG. 6, there is shown the structure of FIG. 5 after gate formation around a central portion 18C" of the suspended at least one semiconductor nanowire 18" which was subjected to the second hydrogen anneal. Specifically FIG. 6 illustrates the structure of FIG. 5 after a gate 26 is formed surrounding the central portion 18C" of each semiconductor nanowire 18". More specifically, FIG. 6 illustrates a structure in which the gate 26 fully wraps around the central portion 18C" of each semiconductor nanowire 18".

The structure shown in FIG. 6 also includes a polysilicon line 34 that caps each of the gates 26 and a hard mask line 36 that is located atop the polysilicon line 34. Although a single gate 26 is shown on each semiconductor nanowire 18", a plurality of gates 26 can be formed on each semiconductor nanowire 18".

The structure shown in FIG. 6 can be formed by first depositing blanket layers of the various material layers of gate 26 (to be described in greater detail herein below) on the entire structure shown in FIG. 5. Then, a blanket layer of polysilicon is formed atop the various layers of the gate 26, and thereafter a blanket layer of hard mask material is formed on the entire surface of the blanket layer of polysilicon. The entire material stack including the materials layers of the gate 26, the blanket layer of polysilicon, and blanket layer of hard mask material, is then patterned by lithography and etching providing the structure shown in FIG. 6. The etch used in forming the structure shown in FIG. 6 may comprise a dry etching process such as, for example, reactive ion etching, plasma etching, or ion beam etching.

Figure 7:
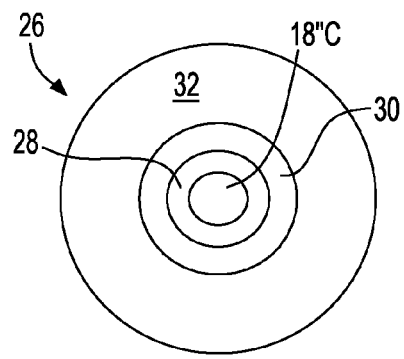
FIG. 7 is a cross sectional view of the gate along the line A-A shown in FIG. 6.

Each gate 26, as shown, for example, in FIG. 7, may comprise a first dielectric material 28, an optional second dielectric material 30, and a metal gate film 32. It is noted that the central portion 18C" of the at least one semiconductor nanowire 18" that is directly beneath the gate 26 serves as a channel of the semiconductor nanowire FET of the present disclosure. The channel 18C" of the semiconductor nanowire channel FETs of the present disclosure forms at a surface of a portion of the at least one semiconductor nanowire 18" that is under the gate (or in the bulk of the nanowire when the nanowire has a diameter smaller than 5 nm). Since the gate 26 fully surrounds the at least one semiconductor nanowire 18", the non-planar semiconductor device of the present disclosure can be referred to as a gate-all-around FET.

The first dielectric material 28 may comprise a semiconductor oxide, semiconductor nitride, semiconductor oxynitride, or a high k material having a dielectric constant greater than silicon oxide. Exemplary high k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, $SiON$, $SiN_x$, a silicate thereof, and an alloy thereof. Each value of x is independently from 0.5 to 3 and each value of y is independently from 0 to 2.

The first dielectric material 28 can be formed by any conventional technique including, for example, deposition or thermal growth, which is well known to those skilled in the art. In one embodiment of the present disclosure, the first dielectric material 28 has a thickness in a range from 1 nm to 10 nm.

The optional second dielectric material 30 may comprise one of the dielectric materials mentioned above for the first dielectric material 28. In one embodiment, the optional second dielectric material 30 is comprised of a same dielectric material as the first dielectric material 28. In another embodiment, the optional second dielectric material 30 is comprised of a different dielectric material as the first dielectric material 28. For example, and in this embodiment, the first dielectric material 28 may comprise silicon oxide, while the optional second dielectric material 30 may comprise a high k gate dielectric such as, for example, $HfO_2$. The optional second dielectric material 30 can be formed utilizing one of the techniques mentioned above in forming the first dielectric material 28. In one embodiment, the thickness of the optional second dielectric 30 may be in a range from 1 nm to 3 nm.

The metal gate film 32 that is formed may comprise an elemental metal (e.g., tungsten, titanium, tantalum, aluminum, nickel, ruthenium, palladium and platinum), an alloy of at least one elemental metal, an elemental metal nitride (e.g., tungsten nitride, aluminum nitride, and titanium nitride), an elemental metal silicide (e.g., tungsten silicide, nickel silicide, and titanium silicide) and multilayered combinations thereof. The metal gate film 32 can be formed utilizing a conventional deposition process including, for example, chemical vapor deposition (CVD), plasma enhanced chemical vapor deposition (PECVD), physical vapor deposition (PVD), sputtering, atomic layer deposition (ALD) and other like deposition processes. When a metal silicide is formed, a conventional silicidation process is employed. In one embodiment, the metal gate film 32 has a thickness from 1 nm to 100 nm.

As stated above, a blanket layer of polysilicon is then formed atop the metal gate film 32 utilizing techniques well known in the art. The blanket layer of polysilicon which is subsequently patterned into polysilicon line 34 can be doped within an appropriate impurity by utilizing either an in-situ doping deposition process or by utilizing deposition, followed by a step such as ion implantation or gas phase doping in which the appropriate impurity is introduced into the blanket layer of polysilicon.

After forming the blanket layer of polysilicon, a blanket layer of a hard mask material is formed atop the blanket layer of polysilicon. The hard mask material may comprise a semiconductor oxide, a semiconductor nitride, a semiconductor oxynitride or any multilayered stack thereof can be used. In one embodiment, the hard mask material employed is silicon nitride. The blanket layer of hard mask material can be formed utilizing any conventional deposition process or thermal growth process that is well known to those skilled in the art.

Figure 8:
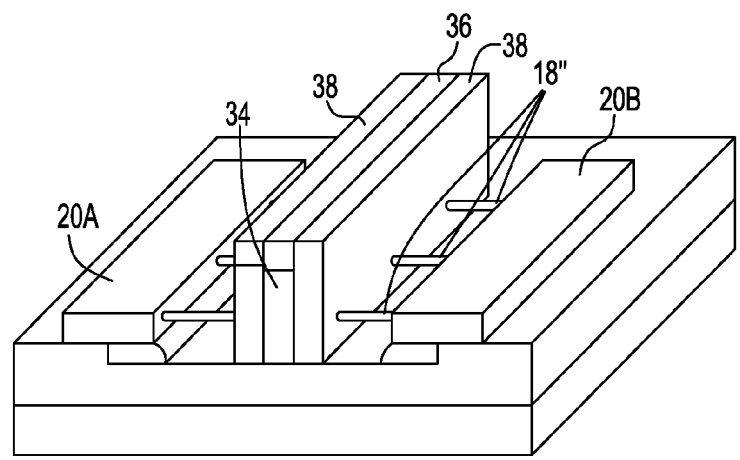
FIG. 8 is a perspective view of the structure shown in FIG. 6 after spacer formation.

Referring to FIG. 8, there is illustrated the structure of FIG. 7 after spacer 38 and 38s formation. As is shown, the spacer 38 is formed on opposing sides of the polysilicon line 34 and on portions of each semiconductor nanowire 18" that are not covered by the gate. Spacer 38s is formed in the undercut region 24. The spacer 38 and spacer 38s can be formed by depositing a blanket dielectric film such as silicon nitride and then etching the dielectric film from all horizontal surfaces. In one embodiment, a reactive ion etch can be used in forming the spacer 38 and the spacer 38s.

In some embodiments, the exposed portions of the semiconductor nanowires 18" and the pad regions 20A, 20B can be removed at this point of the present process utilizing a selective reactive ion etching process. In one embodiment, the selective reactive ion etching process can include HBr chemistry. When the exposed portions of the semiconductor nanowires 18" and the pad regions 20A, 20B are removed, end portions of the cut semiconductor nanowires, not covered by the gate or spacer, will be exposed. The exposed end portions can be used in the subsequent step to form nanowire extensions which include an epitaxially semiconductor material that is in direct contact with the exposed end portions of the cut semiconductor nanowire. In such an embodiment, one of the nanowire extensions serves as a source region of the device, while the other nanowire extension serves as a drain region.

Figure 9:
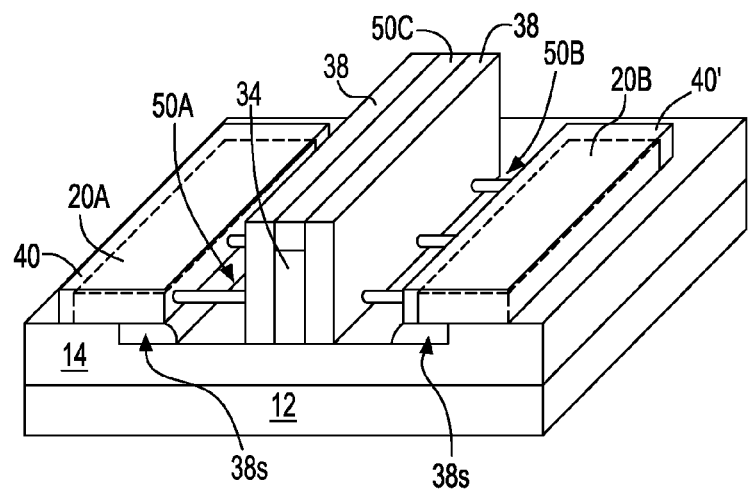
FIG. 9 is a perspective view of the structure shown in FIG. 8 after formation of a source region and a drain region.

Referring to FIG. 9, there is illustrated the structure of FIG. 8 after formation of a source region on one side of the gate and a drain region on the other side of the gate. The source and drain regions are formed by a selective epitaxial growth process that thickens the exposed semiconductor nanowire 18" surfaces forming a first thickened semiconductor nanowire portion 50A and a second thickened semiconductor nanowire portion 50B which are not covered by the gate and spacers. The epitaxial growth also thickens the SOI pad regions 20A, 20B. In some embodiments, the hard mask line 36 is removed from the polysilicon line 34 prior to selective epitaxial growth utilizing a conventional stripping process. In such an embodiment and as shown in FIG. 9, an epitaxial semiconductor layer 50C forms atop the polysilicon line 34.

In the drawing, reference numeral 40 denotes the epitaxial semiconductor layer that is formed atop the first pad region 20A, while numeral 40' denotes the epitaxial semiconductor layer that is formed atop the first pad region 20B. In accordance with the present disclosure the source region includes epitaxial semiconductor layer 40 as well as the first thickened semiconductor nanowire portion 50A, while the drain region includes epitaxial semiconductor layer 40' as well as the second thickened semiconductor nanowire portion 50B.

The epitaxial growth may merge the adjacent semiconductor portions together. In one embodiment, the thickened/merged nanowire portions 50A, 50B and SOI pad regions 20A, 20B are formed by epitaxially growing, for example, in-situ doped silicon (Si) or a silicon germanium (SiGe) that may be either n-type or p-type doped. The in-situ doped epi process forms the source region and the drain region of the nanowire FET. As an example, a chemical vapor deposition (CVD) reactor may be used to perform the epitaxial growth. Precursors for silicon epitaxy include $SiCl_4$, $SiH_4$ combined with HCl. The use of chlorine allows selective deposition of silicon only on exposed silicon surfaces. A precursor for SiGe may be $GeH_4$, which may obtain deposition selectivity without HCl. Precursors for dopants may include $PH_3$ or $AsH_3$ for n-type doping and $B_2H_6$ for p-type doping. Deposition temperatures may range from 550° C. to 1000° C. for pure silicon deposition, and as low as 300° C. for pure Ge deposition.

Figure 10:
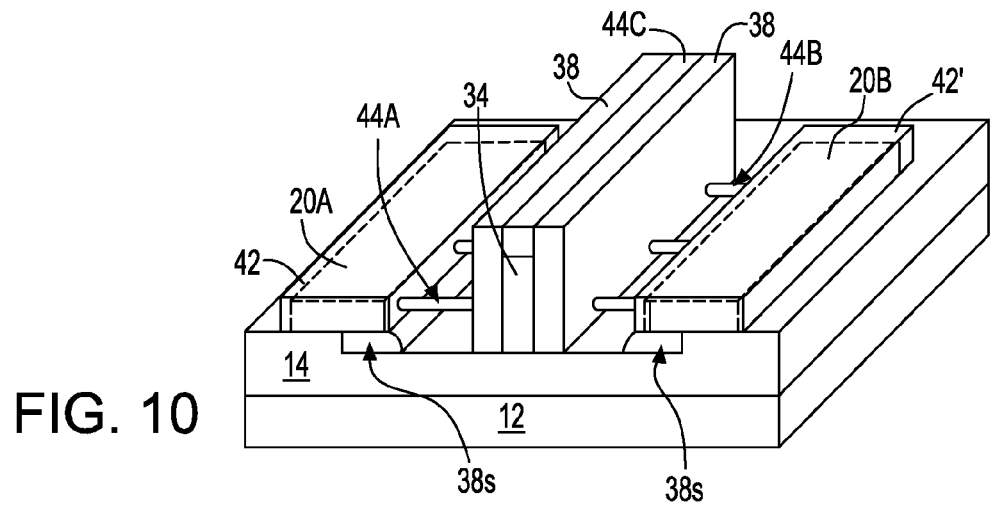
FIG. 10 is a perspective view of the structure shown in FIG. 9 after formation of a metal semiconductor alloy layer atop the source region and the drain region.

Referring to FIG. 10, there is illustrated the structure shown in FIG. 9 after formation of a metal semiconductor alloy layer atop the source region and the drain region. The metal semiconductor alloy layer can be formed by first depositing a metal semiconductor alloy forming metal such as for example, Ni, Pt, Co, and alloys such as NiPt, on the surface of the epitaxial grown semiconductor layer including layers 50A, 50B, 50C, 40 and 40'. An anneal is then performed that causes reaction between the metal semiconductor alloy forming metal and the epitaxial semiconductor layer. After annealing, any unreactive metal can be removed. When Ni is used the NiSi phase is formed due to its low resistivity. For example, formation temperatures include 400° C.-600° C.

In the drawing, reference numerals 42 and 42' denote a metal semiconductor alloy that is formed atop the first and second SOI pads 20A and 20B, respectively, reference numeral 44A denotes the metal semiconductor alloy that is formed on the first thickened semiconductor nanowire portion 50A, and reference numeral 44B denotes the metal semiconductor alloy that is formed on the second thickened semiconductor nanowire portion 50B. In embodiments in which the hard mask line 36 was removed, a metal semiconductor alloy layer 44C can form atop the polysilicon line 34, as is shown in FIG. 7.

Once the metal semiconductor alloy layer is formed, capping layers and vias for connectivity (not shown) may be formed.

As stated above, by breaking the hydrogen anneal into two separate hydrogen anneals, i.e., pre suspension hydrogen anneal, and a post suspension hydrogen anneal, tight pitch semiconductor nanowires survive, while such tight pitch nanowires are completely destroyed utilizing a single-step hydrogen anneal. This aspect of the present disclosure can be shown in the SEMs shown in FIGS. 11A, 11B, 11C, 12, 13A, 13B, 13C and 14.

Figure 11A:
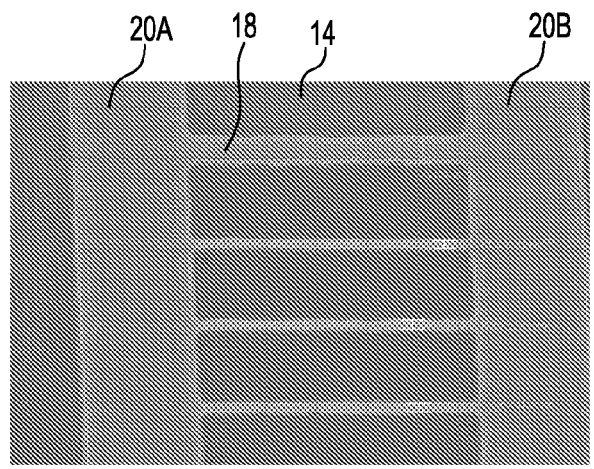
FIG. 11A is an SEM image of an actual structure including a plurality of silicon nanowires located on an insulator layer of an SOI substrate, each of the silicon nanowires has an end segment connected to a first SOI pad region and another end segment connected to a second SOI pad region.

Specifically, FIG. 11A is an SEM image of an actual structure including a plurality of silicon nanowires 18 of variable diameter located on an insulator layer 14 of an SOI substrate which is formed as described above in providing the structure shown in FIG. 2. In this particular test structure, the nanowires have different starting width: the nanowire closest to the top of the image being the widest, the nanowire right below being the narrowest, and the following two nanowires being increasingly wider in width. Due to line roughness, the difference in size of the last three nanowires is only observable in the following steps, after line roughness is reduced.

Figure 11B:
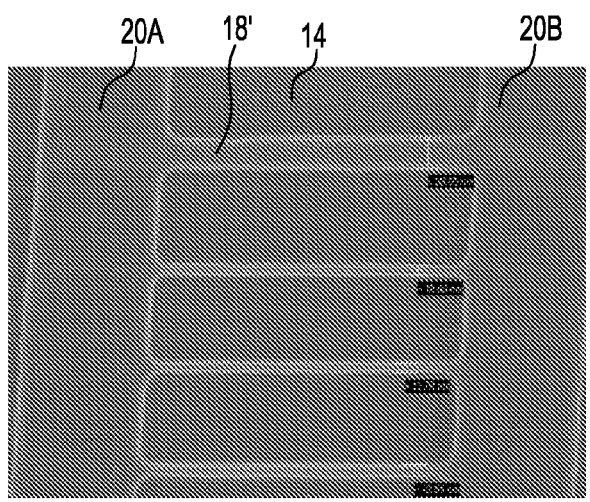
FIG. 11B is an SEM image of the structure shown in FIG. 11A after performing a first hydrogen anneal in accordance with an embodiment of the present disclosure.
Figure 11C:
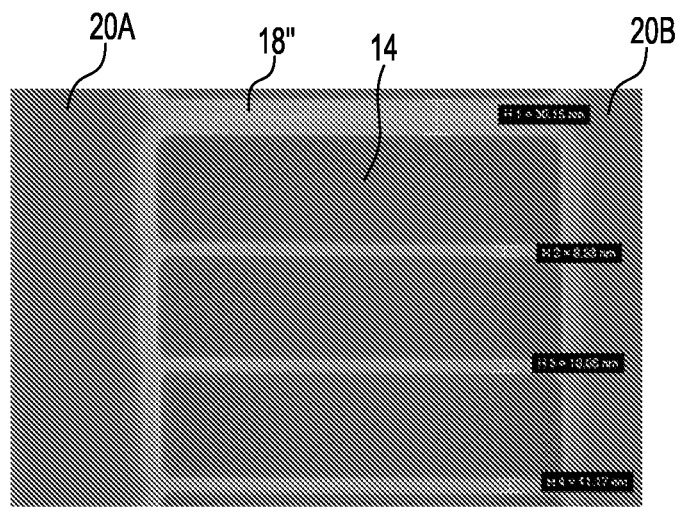
FIG. 11C is an SEM image of the structure shown in FIG. 11B after suspending the silicon nanowires and performing a second hydrogen anneal in accordance with an embodiment of the present disclosure.
Figure 12:
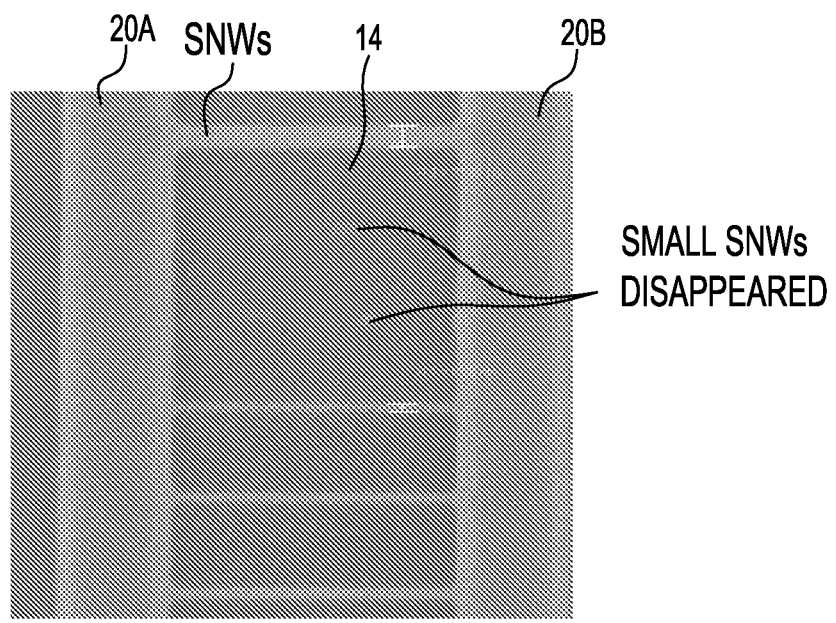
FIG. 12 is an SEM image of the structure shown in FIG. 11A after performing a single-step hydrogen anneal in accordance with the current state of the art.

Each silicon nanowire 18 has an end segment connected to a first SOI pad region 20A and another end segment connected to a second SOI pad region 20B. As can be seen in FIG. 11A, the starting sidewalls of the Si nanowires are rough. FIG. 11B is an SEM image of the structure shown in FIG. 11A after performing a first hydrogen anneal in accordance with an embodiment of the present disclosure. As can be seen in the SEM, the sidewalls of the Si nanowires are smoothened into long-range steps, rather than higher-curvature bumps. FIG. 11C is an SEM image of the structure shown in FIG. 11B after suspending the silicon nanowires and performing a second hydrogen anneal in accordance with an embodiment of the present disclosure. As is seen in this SEM, the Si nanowires are smoothed, without significantly reducing the size of the Si nanowires. In comparison, FIG. 12 is an SEM image of the structure shown in FIG. 11A after performing a single-step hydrogen anneal in accordance with the current state of the art. While the single-step hydrogen anneal of the prior art smooths the sidewalls of the Si nanowires, the smallest Si nanowires are completely removed from the structure.

Figure 13A:
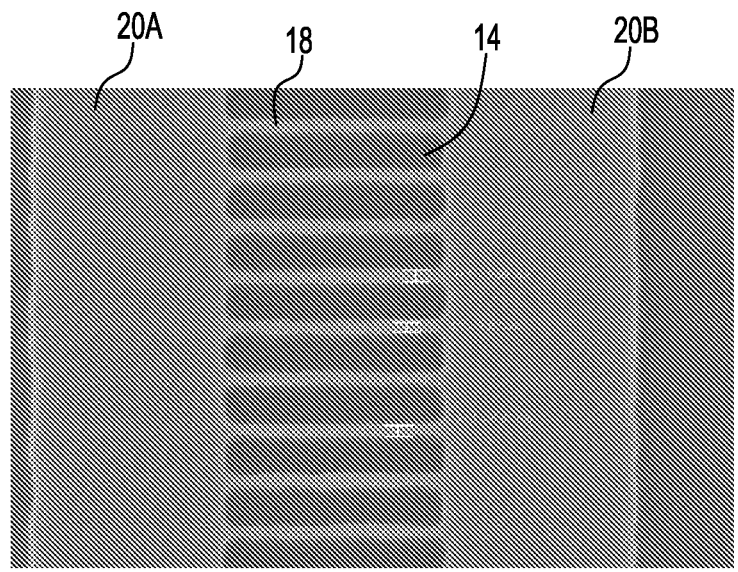
FIG. 13A is an SEM image of an actual structure including a plurality of silicon nanowires located on an insulator layer of an SOI substrate, each of the silicon nanowires has an end segment connected to a first SOI pad region and another end segment connected to a second SOI pad region.
Figure 13B:
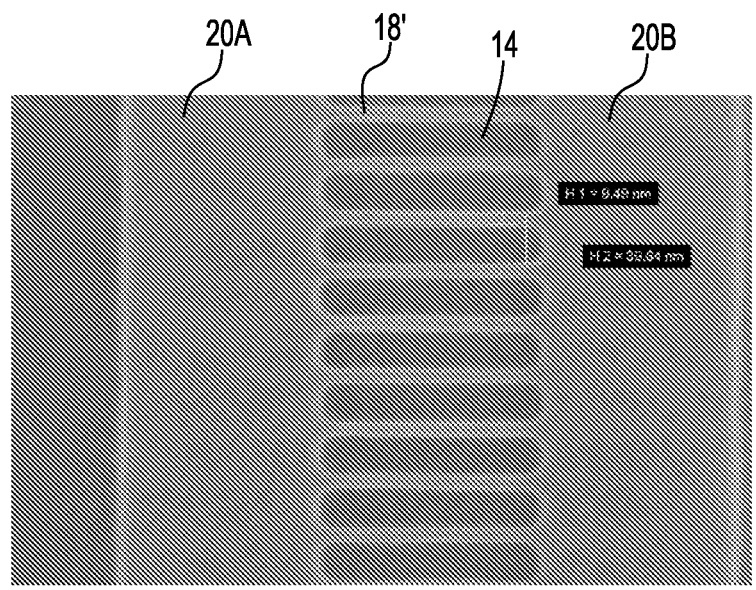
FIG. 13B is an SEM image of the structure shown in FIG. 13A after performing a first hydrogen anneal in accordance with an embodiment of the present disclosure.
Figure 13C:
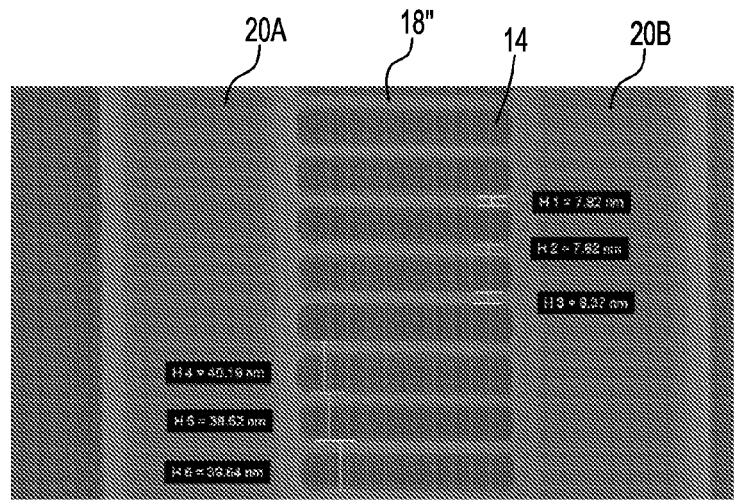
FIG. 13C is an SEM image of the structure shown in FIG. 13B after suspending the silicon nanowires and performing a second hydrogen anneal in accordance with an embodiment of the present disclosure.
Figure 14:
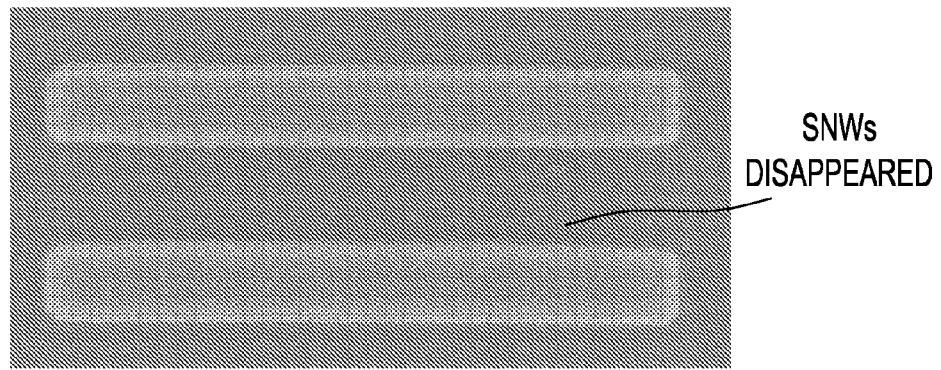
FIG. 14 is an SEM image of the structure shown in FIG. 13A after performing a single-step hydrogen anneal in accordance with the current state of the art.

FIG. 13A is an SEM image of an actual structure including a plurality of small silicon nanowires 18, patterned at 40 nm pitch, located on an insulator layer of an SOI substrate, which is formed as described above in providing the structure shown in FIG. 2. Each of silicon nanowire 18 has an end segment connected to a first SOI pad region 20A and another end segment connected to a second SOI pad region 20B. As can be seen in FIG. 13A, the starting sidewalls of the Si nanowires are rough. FIG. 13B is an SEM image of the structure shown in FIG. 13A after performing a first hydrogen anneal in accordance with an embodiment of the present disclosure. As can be seen in the SEM, the sidewalls of the Si nanowires are smoothened into long-range steps, rather than higher-curvature bumps. FIG. 13C is an SEM image of the structure shown in FIG. 13B after suspending the silicon nanowires and performing a second hydrogen anneal in accordance with an embodiment of the present disclosure. As is seen in this SEM, the Si nanowires are nicely smoothed, without significantly reducing the size of the Si nanowires. In comparison, FIG. 14 is an SEM image of the structure shown in FIG. 13A after performing a single-step hydrogen anneal in accordance with the current state of the art. As is shown in FIG. 14, all the small nanowires (SNWs) are completely removed from the structure.

While the present disclosure has been particularly shown and described with respect to various embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A method of fabricating a semiconductor nanowire comprising:
    forming at least one semiconductor nanowire from at least an uppermost semiconductor layer of a substrate, wherein an end segment of said at least one semiconductor nanowire is attached to a first semiconductor pad region and another end segment of said at least one semiconductor nanowire is attached to a second semiconductor pad region;
    performing a first hydrogen anneal on said at least one semiconductor nanowire with at least a bottommost surface of said at least one semiconductor nanowire in direct contact with an uppermost surface of said substrate;
    removing a portion of said substrate located beneath said at least one semiconductor nanowire to suspend said at least one semiconductor nanowire above a remaining portion of said substrate; and
    performing a second hydrogen anneal on said at least one semiconductor nanowire that is suspended above the remaining portion of said insulator layer.

2. The method of claim 1, wherein during said first hydrogen anneal, an uppermost surface of the at least one semiconductor material is protected by a patterned mask.

3. The method of claim 1, wherein said first hydrogen anneal is performed at a temperature from 600° C. to 1000° C. at a hydrogen pressure of from 7 torr to 600 torr.

4. The method of claim 1, wherein said removing the portion of said substrate located beneath said at least one semiconductor nanowire comprises an isotropic etching process.

5. The method of claim 1, wherein said second hydrogen anneal is performed at a temperature from 600° C. to 1000° C. at a hydrogen pressure of from 7 torr to 600 torr.

6. The method of claim 1, wherein said first hydrogen anneal is performed at a temperature, pressure or temperature and pressure which is greater than a temperature, pressure or temperature and pressure of said second hydrogen anneal.

7. The method of claim 1, further comprising performing an oxidation process at a temperature of greater than 700° C. and etching grown oxide to thin said at least one semiconductor nanowire after performing said second hydrogen anneal.

8. The method of claim 1, further comprising growing a chemical oxide from the at least one semiconductor nanowire and etching grown oxide to thin said at least one semiconductor nanowire after performing said second hydrogen anneal.

9. The method of claim 1, wherein said at least one semiconductor nanowire prior to performing said first hydrogen anneal has a first roughness, said at least one semiconductor nanowire after said performing the first hydrogen anneal and prior to performing the second hydrogen anneal has a second roughness, and said at least one semiconductor nanowire after performing said second hydrogen anneal has a third roughness, wherein said first roughness is greater than the second roughness, and said second roughness is greater than the third roughness.

10. The method of claim 9, wherein said first roughness, expressed in terms of a mean squared roughness, is from 0.5 nm to 5 nm, said second roughness, expressed in terms of a mean squared roughness, is from 0.3 nm to 2 nm, and said third roughness, expressed in terms of a mean squared roughness, is from 0.1 nm to 1 nm.

11. The method of claim 1, wherein said at least one semiconductor nanowire prior to performing said first hydrogen anneal has a first width, said at least one semiconductor nanowire after performing said first hydrogen anneal and prior to performing said second hydrogen anneal has a second width, and said at least one semiconductor nanowire after performing said second hydrogen anneal has a third width, wherein said first width, said second width and said third width are substantially the same.

12. The method of claim 1, wherein said at least one semiconductor nanowire after performing said first hydrogen anneal and prior to performing said second hydrogen anneal has a second width, and said at least one semiconductor nanowire after performing said second hydrogen anneal has a third width, wherein said second width is greater than said third width.

13. The method of claim 1, wherein said at least one semiconductor nanowire after performing said first hydrogen anneal and prior to performing said second hydrogen anneal has a second width, and said at least one semiconductor nanowire after performing said second hydrogen anneal has a third width, wherein said second width is less than said third width.

14. The method of claim 1, wherein said at least one semiconductor nanowire comprises a plurality of semiconductor nanowires, wherein a pitch between each of the semiconductor nanowires is from 5 nm to 70 nm.

15. The method of claim 1, wherein substrate further includes at least one other semiconductor layer beneath the uppermost semiconductor layer, said at least one other semiconductor layer comprises a different semiconductor material than the uppermost semiconductor layer.

16. The method of claim 1, wherein said substrate further includes an insulator layer located directly beneath the uppermost semiconductor layer.

* * * * *